United States Patent [19]

Uwano

[11] 4,331,940
[45] May 25, 1982

[54] SOLID-STATE MIC OSCILLATOR
[75] Inventor: Tomoki Uwano, Hirakata, Japan
[73] Assignee: Matsushita Electric Industrial Co., Ltd., Osaka, Japan
[21] Appl. No.: 156,195
[22] Filed: Jun. 3, 1980
[30] Foreign Application Priority Data
  Jun. 4, 1979 [JP] Japan .................................. 54-70316
[51] Int. Cl.³ .......................... H03B 5/18; H03B 7/14; H03B 9/14
[52] U.S. Cl. ............................... 331/99; 331/107 SL; 331/117 D
[58] Field of Search ..................... 331/96, 99, 107 DP, 331/107 SL, 117 D, 107 C, 107 G, 107 T, 176

[56] References Cited
U.S. PATENT DOCUMENTS
4,149,127  4/1979  Murakami et al. .................. 331/96
4,187,476  2/1980  Shinkawa et al. ............... 331/117 D OTHER PUBLICATIONS
*Electronics*, vol. 51, Jun. 22, 1978, pp. 68, 70, "Compact Dielectric Ceramic Resonator Simplifies Microwave Frequency Control".
Abe et al., "Stabilized, Low-Noise GaAs FET Integrated Oscillator", *Digest of Technical Papers*, ISSCC77, Feb. 17, 1977, pp. 168-169.

*Primary Examiner*—Siegfried H. Grimm
*Attorney, Agent, or Firm*—Wenderoth, Lind & Ponack

[57] ABSTRACT

A solid-state MIC oscillator in the form of a planar transmission circuit has a band rejection filter as a load circuit of an oscillation device. The band rejection filter is a resonator coupled to a transmission line which connects the oscillation device with an oscillator load. The load impedance of the oscillation device is adjusted to the oscillating condition by the position of the resonator. A simple capacitive susceptance stub is connected to the transmission line near the coupling point of the resonator. Variation of the oscillator frequency characteristics versus temperature caused by variation of the oscillator load is improved in an excellent manner due to the provision of the simple capacitive susceptance stub.

2 Claims, 11 Drawing Figures

SOLID-STATE MIC OSCILLATOR

This invention relates to a solid-state MIC (microwave integrated circuit) oscillator using a transistor, an FET, a Gunn diode or some other solid-state device, which has a superior temperature stability and a constant characteristics versus variation of a load impedance, and can be applied to a pump signal source for a microwave down-converter.

It is known that a Gunn diode, an Impatt diode, a transistor or an FET is used as a microwave solid-state oscillation device, and a resonator such as a half-wavelength microstrip line, a YIG resonator or a dielectric resonator is used for the oscillator to make an oscillation frequency condition. Generally an oscillation frequency of the solid state oscillator depends on a circumstance temperature more or less because of the temperature dependance of an oscillation device itself and that of the other elements which constructs the oscillator. Therefore, in order to stabilize the oscillation frequency, a resonator might have a high external Q value (therefore high unloaded Q) or might have a suitable resonant frequency temperature characteristics which compensate the device temperature dependance or might have both high Q value and suitable temperature characteristics.

When an oscillator is constructed as a BRF (band rejection filter) type oscillator which has a resonator inserted between the load and the oscillation device such as Gunn diode, and the BRF makes appropriate impedence for oscillating condition of the oscillation device together with the oscillator load, the variation of the load impedance directly gives influence to the oscillation frequency temperature characteristics. This problem might be solved if an isolator or an attenuator pad is used between a load and an oscillator. However, an isolator is bulky, needs wide space to be installed, and is very expensive. An attenuator pad is expected to have necessary effects, if it has a large attenuation value, but the large attenuation pad lowers the oscillator output power.

It is an object of this invention to provide a simple solid-state MIC oscillator which has high temperature stability against the variation of the output load impedance.

This object is achieved according to this invention by providing a solid-state MIC oscillator fabricated in the form of a planar transmission circuit and comprising: a solid-state oscillation device; a resonator coupled to a transmission line connecting the oscillation device with an oscillator load circuit, electromagnetically at a first position on the transmission line, and operating as a band rejection filter which is a load circuit of the oscillation device; and a capacitive susceptance element which is connected to the transmission line at a second position, an equivalent electrical angle between the first position and the second position being between zero and $\pi/4$ radian (45°) and the second position being located toward the oscillator load circuit from the first position, so as to decrease variation of oscillation temperature frequency characteristics caused by variation of the oscillator load circuit. According to a further development of this invention, the resonator has linear temperature resonant frequency variation characteristics in order to compensate the temperature characteristics of the oscillation device.

In accordance with this invention, a simple, highly temperature-stabilized and compact MIC oscillator is provided by merely using a capacitive susceptance stub on the output microstrip transmission line of the oscillator. A load of the small power oscillator which operates as supplier of the pump signal for a down-conversion mixer is generally an SBD (Schottky Barrier Diode) or sometimes a combination of SBD's and a hybrid circuit. Therefore, load impedance is the impedance of an SBD or that of a combination of SBD's and a hybrid.

An SBD is generally packaged in a certain capsule such as a ceramic drum or a glass package. Conditions of bonding wire which connects the chip of an SBD and the outer conductor of the package are different from SBD to SBD, and this means the variation of the diode impedance. In addition, the impedance of an SBD varies in accordance with the supplying power, which means non-linear impedance characteristics.

Because of the reason above, load impedance of the pumping signal source as to each converter is not always under the same condition, and this changes the profile of the temperature characteristics of the oscillator.

A capacitive susceptance stub provided by this invention lowers the impedance at the point where the BRF is coupled electromagnetically and reduces the variation of the load impedance. This susceptance stub is very simple and easy to fabricate, because it is only a conductor pattern on the dielectric substrate. Power reduction by the stub is slight, such as less than a few dB, and the variation of the temperature characteristics by the variation of the load is excellently improved.

When the resonator of a BRF has linear temperature characteristics about the resonant frequency in order to compensate the temperature characteristics of the oscillation device, the effect of this invention is more remarkable.

This invention will be described in detail with the aid of the accompanying drawings, in which.

Figure 1:
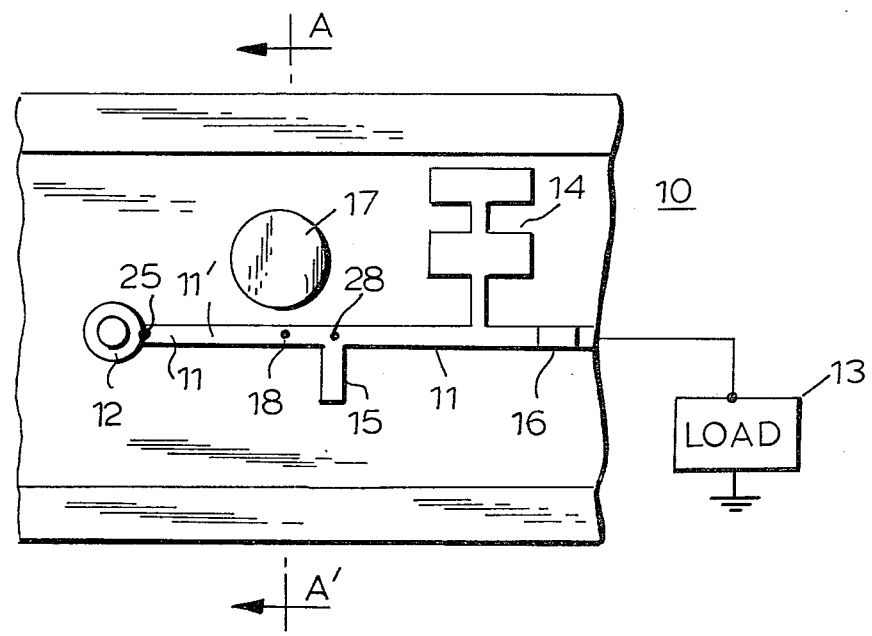
FIG. 1 is a schematic top plan view of an example of a solid-state MIC oscillator in accordance with this invention.
Figure 1A:
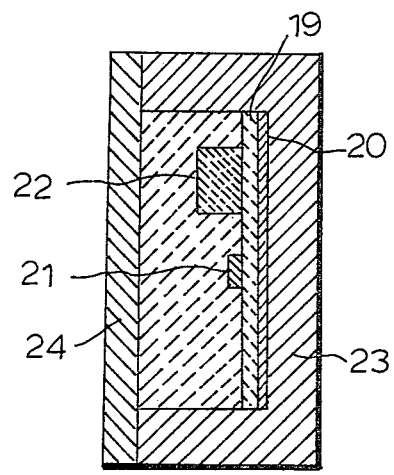
FIG. 1A is a schematic cross-sectional view of the oscillator of FIG. 1 taken along the line A—A' of FIG. 1, and additionally showing a shielding cover which can be used in conjunction with the oscillator.

Referring to FIG. 1 and FIG. 1A, reference numeral 10 designates a Gunn diode microwave oscillator fabricated in the form of a planar circuit, the conductor pattern of which includes a microstrip transmission line 11 which connects an oscillation device 12 with a matched-load 13, an rf choking block 14 for supplying a dc bias, and a capacitive susceptance stub 15 of this invention.

A chip capacitor or a quarter-wavelength microstrip line gap circuit as a dc block 16 is inserted in the microstrip line 11 between the dc bias circuit 14 and the load 13 to prevent the bias current flow to the load 13. A dielectric resonator 17 is electromagnetically coupled at the position 18 on the transmission line 11.

These figures show a planar transmission line of a microstrip type having a dielectric substrate 19 having conductive ground layer 20 provided on the bottom surface thereof and a conductive pattern 21 deposited on the front surface thereof parallel to the ground layer 20. The conductor pattern can be deposited by conventional thin-film process or by thick-film process. In the cross-section of the oscillator shown, this conductor pattern 21 shows transmission line 11, and reference numeral 22 shows the dielectric resonator 17. Other elements shown in FIG. 1 are also included in the conductor pattern.

The microstrip line can be enclosed in a conductive shield conveniently formed by two separable portions. The first portion forms a channel 23, on an internal surface of which the ground layer 20 is provided and the side walls of which define the width of the channel. The other portion, which forms a cover 24, mates with the channel 23 by conventional means to complete the enclosure and forms a rectangular cross-section. The shield is not always necessary for operation of the invention, but microstrip line circuits are conveniently enclosed by such a shield to prevent radiation of energy. Accordingly, the channel 23 and the cover 24 are included in the interest of completeness.

The Gunn diode 12 packages with a capsule-type package operates as a two-terminal negative resistor at microwave band. One terminal of the Gunn-diode is connected to the ground plane 20 and the channel 23 which sinks the heat from the diode, the other terminal being connected to the transmission line 11 at the point 25. A dc bias is supplied to the Gunn diode 12 through the rf choking circuit 14 and the transmission line 11. Though conveniently the oscillation device is a Gunn-diode in FIG. 1, operation of this invention is the same when the oscillation device is changed to another two-terminal negative resistance device such as an Impatt diode or a tunnel diode, a transistor or an FET. Transistors and FET's are three-terminal devices, but operate equivalently as two-terminal negative resistors with proper feedback networks.

Generally the characteristic impedance of the microstripline 11 is designed to be the same value as that of measurement apparatus (e.g. 50Ω), or especially, the characteristic impedance of the transmission line 11', which is a portion of the transmission line 11 between the Gunn diode 12 and the coupling point 18, might be chosen to be a lower value (e.g. 10 to 20Ω).

The load impedance at the position 18 where the dielectric resonator 17 for BRF is equivalently coupled becomes high at the resonant frequency fo of the resonator 17. The value of the impedance depends on the coupling magnitude, and the impedance goes high in accordance with the large coupling. This high impedance is converted to low impedance at the position 25, where the transmission line 11 and the Gunn-diode is connected, by the transmission line 11' which operates as an impedance converter. This low impedance satisfies the oscillating condition of the Gunn-diode 12. So, the oscillation frequency of the oscillator 10 is fo. Generally, the oscillation frequency is not accurately fo but is near fo, because the oscillating condition of the Gunn diode varies by internal or external conditions (e.g. circumstance temperature).

The higher is the unloaded Q value (Qu) of the resonator 17, the more is the variation of the load impedance at the position 25 against the variation of the frequency from fo. Therefore, if Qu is high enough, it satisfies the oscillation frequency condition extremely near fo against the variation of the oscillation device characteristics by temperature variation. To improve the stabilizing characteristics still more, a resonator having a slight linear-temperature resonant frequency characteristics is commonly used which is opposite to that of the oscillation device, compensating the characteristics.

Figure 2:
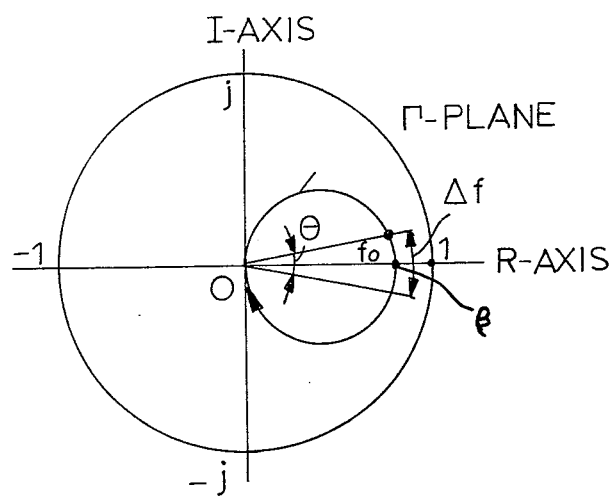
FIG. 2 is a graph showing a frequency impedance trace on complex reflection plane for explaining the operation of the resonator of FIG. 1.

Without the circuit of this invention, the operation of the BRF (that is, resonator 17) is shown as follows. FIG. 2, FIG. 2A, FIG. 2B, FIG. 2C and FIG. 2D show frequency impedance traces at the coupling point 18 on complex reflection planes (Γ-plane) with respect to the variation of load impedance. These Γ-planes are normalized by the characteristic impedance of transmission line 11. The trace 26 shown in FIG. 2 is that when the load 13 has ideal impedance and there is no reflection. The trace 26 turns clockwise against frequency increasing. The value of the point β, where the real axis of Γ-plane and the frequency impedance trace 26 cross each other at fo, approaches up to 1 (unity) upon increasing the coupling factor of the resonator 17. Assuming the value of β constant, the length of the trace against a certain frequency variation Δf, therefore the value of angle θ, becomes large in accordance with the increasing of Qu of the resonator. It is an important point to let the angle θ be constant in order to let the oscillation stability be constant.

When the load 13 is not ideal, and there is a little signal reflection from the load 13, the traces are classified to four groups shown in FIG. 2A to FIG. 2D. Referring to FIG. 2A to FIG. 2D, the angle θ's of the traces against the constant frequency variation Δf have the least value under the condition of FIG. 2A, and the other three cases show similar θ values to that of FIG. 2. Therefore, in the case of FIG. 2A, the trace is equal to that in the case of decreasing the Qu value, and this means bad stability.

Figure 2A:
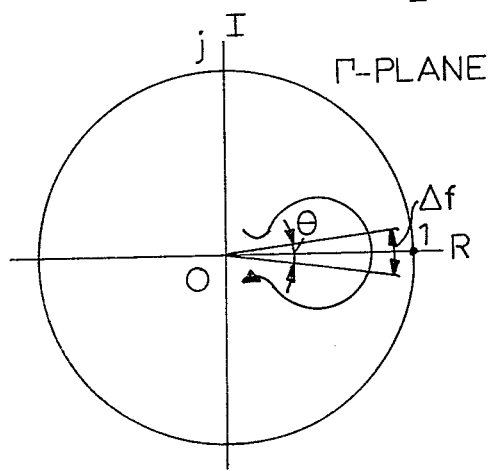
FIG. 2A to FIG. 2D are graphs showing frequency impedance traces when the oscillator load impedance of FIG. 1 is not ideal, and for explaining the classified four groups against variations of the load impedance.
Figure 2B:
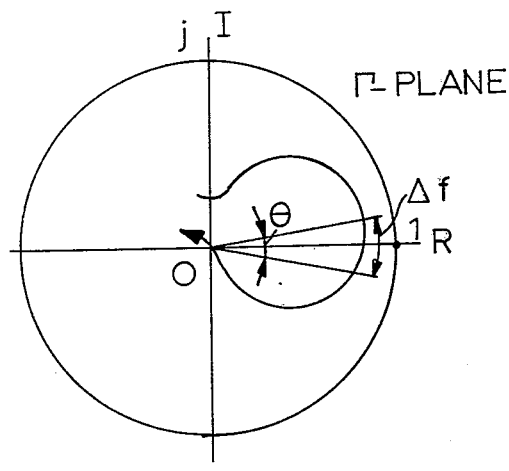
Figure 2C:
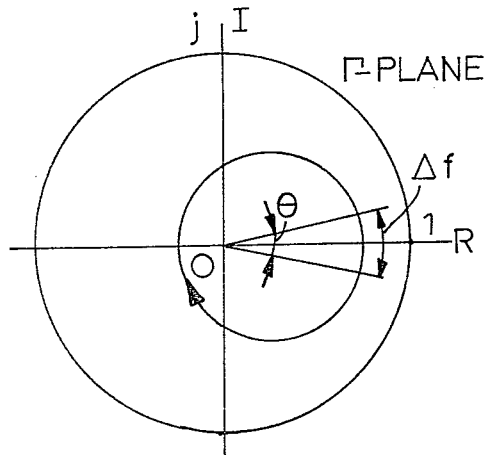
Figure 2D:
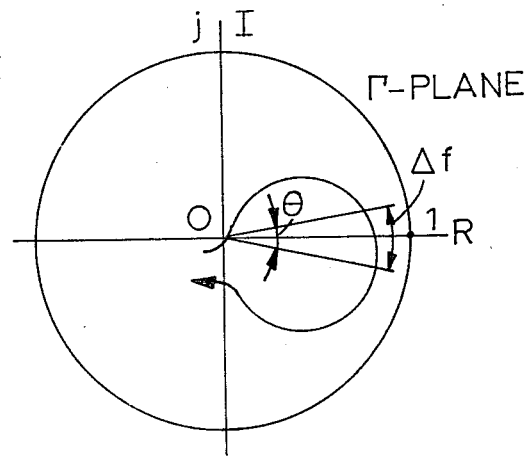

The circuit of this invention solves the problem that the stability gets worse in the case shown in FIG. 2A.

Figure 3:
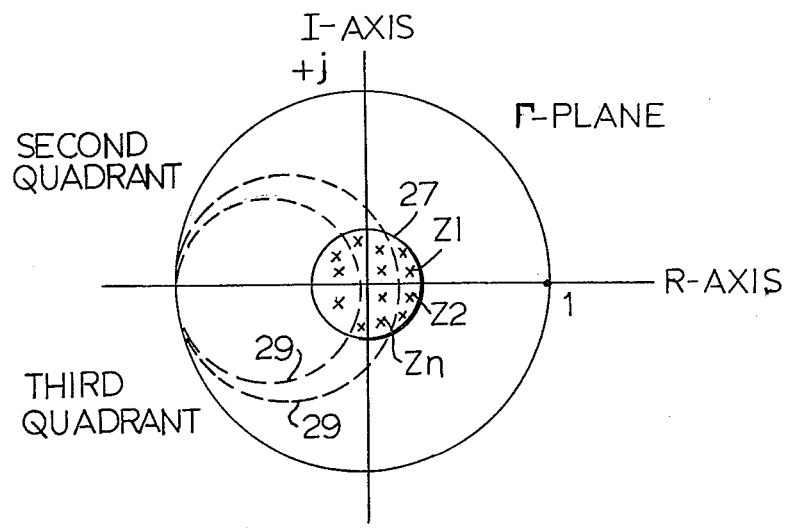
FIG. 3 is a graph showing variation of the oscillator load impedances and for explaining the operation of this invention.

FIG. 3 shows the distribution of load impedance $Z_1$ to $Z_n$ inside of a certain VSWR circle 27 of the Γ-plane. Concerning all these load impedances $Z_l$ to $Z_n$, the impedance at the position 28, where a capacitive susceptance stub 15 connects to the transmission line 11, can be converted to those in the third quadrant (negative real, negative imaginary quarter plane) along constant admittance circles 29 in FIG. 3 by using the capacitive susceptance stub 15. The length of the stub 15 (that is, the capacitance of the stub) depends on the radius of the VSWR circle 27, and needs to be longer in accordance with a larger radius.

Choosing the electrical length between the position 18 and the position 28 of the transmission line 11 to be equivalently the value within π/4 radian (0° to 45°), all load impedances come to the second or the third quadrant when the resonator 17 is not coupled. And this means that the traces, when the resonator 17 is coupled, belong to either groups shown in FIG. 2B, FIG. 2C, and FIG. 2D, and can avoid belonging to the group under the most unstable condition of FIG. 2A. Therefore, the influence to the temperature frequency characteristics from the variation of load impedance can be decreased by this invention. Still more, this invention is especially useful when the resonator 17 has temperature resonant frequency characteristics to compensate the oscillation device temperature characteristics.

Figure 4:
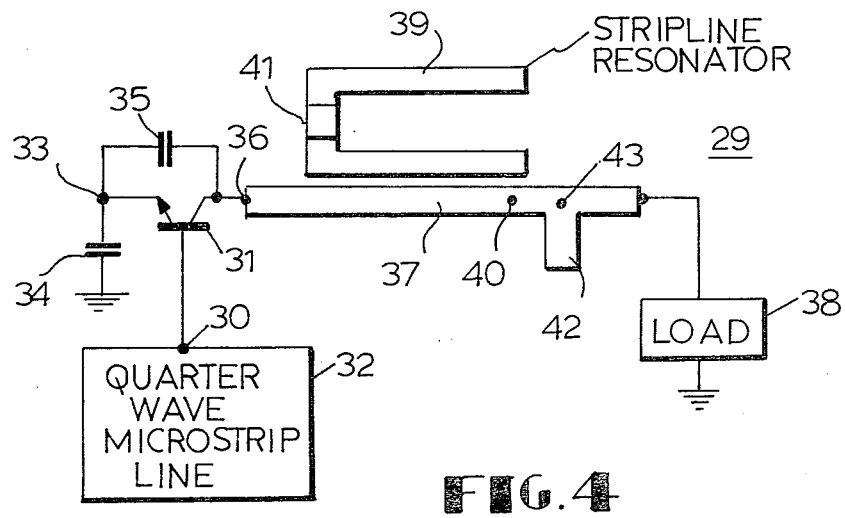
FIG. 4 is a schematic equivalent conductor pattern of another example of a transistor MIC oscillator in accordance with this invention.

FIG. 4 shows another solid-state MIC oscillator of this invention using a transistor as an oscillation device. The circuit shown in FIG. 4 is only the main conductor pattern which is in the interest of the operation. Though dc bias circuits are abbreviated, they are necessary to operate the oscillator.

Reference numeral 29 designates a transistor microwave oscillator fabricated in the same manner as shown in FIG. 1 and FIG. 1A.

The base port 30 of a transistor 31 is equivalently grounded by connecting a quarter-wavelength microstrip line 32, the opposite end of which is open-terminated. The emitter port 33 is grounded through capacitor 34 which is the combination of strayed capacitance and transistor inner capacitance. The capacitor 34 and a transistor inner capacitor 35 between the emitter port 33 and the collector port 36 construct a feedback network for Colpitts type oscillation, and the transistor 30 works as a two terminal negative resistor at the collector port 36.

To the transmission line 37 which connects the collector 36 and a load 38 is coupled a stripline resonator 39 at the equivalent coupling position 40. The strip line resonator 39 is that of a half-wavelength-type and has a chip capacitor 41 inserted in the middle of the resonator. The chip capacitor 41 has negative temperature capacitance variation characteristics, so the stripline resonator 39 has position temperature resonant frequency variation characteristics to compensate the temperature characteristics variation of the transistor oscillating condition.

The electrical length of the transmission line 37 between the collector port 36 and the coupling point 40 is decided so that the load impedance at position 36 corresponds with the oscillating condition of the transistor. The capacitive susceptance stub 42 of this invention is connected at the position 43 where the electrical angle from the position 40 is at most $\pi/4$ radian (0° to 45°). The oscillation frequency is temperature-stabilized by the stripline resonator 39 having temperature compensation characteristics.

Figure 5:
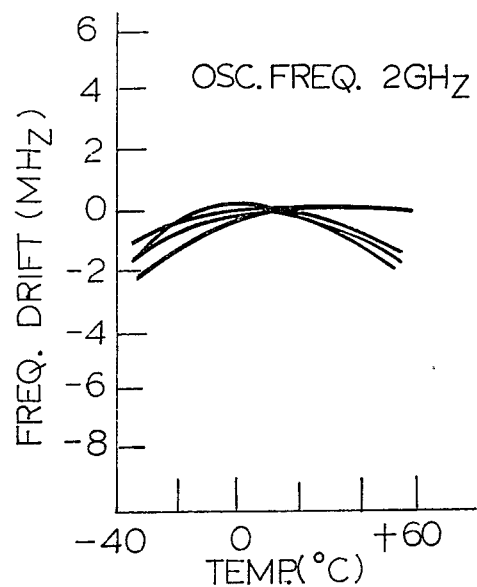
FIG. 5 is a graph showing the oscillation frequency temperature characteristics of the oscillator of FIG. 4 and for explaining the feature of this invention.
Figure 5A:
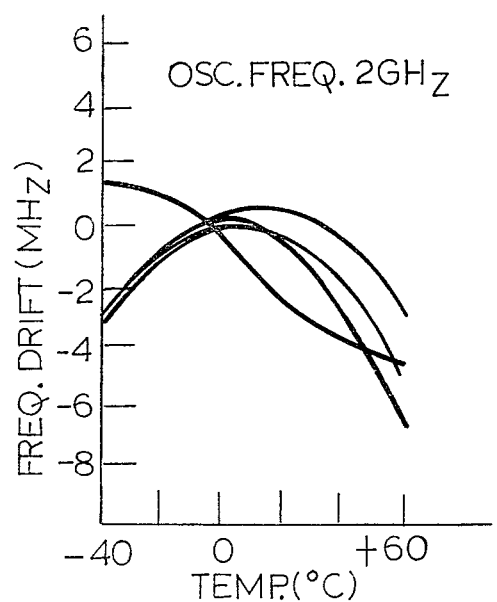
FIG. 5A is a graph showing the oscillation frequency temperature caracteristics of the oscillator similar to FIG. 4 but not using this invention.

FIG. 5 is a graph showing some examples of temperature oscillation frequency characteristics of the oscillator 29 when the oscillation frequency is about 2 GHz, and FIG. 5A is that without the stub of this invention. Excellent effects of this invention are recognized by FIG. 5 and FIG. 5A.

What is claimed is:

1. A solid-state MIC (microwave integrated circuit) oscillator fabricated in the form of a planar transmission circuit and comprising:

a solid-state oscillation device;

a transmission line connecting said oscillation device with an oscillator load circuit; a resonator coupled electromagnetically at a first position on said transmission line, and operating as a band rejection filter which is a load circuit of said oscillation device; and a capacitive susceptance element which is connected to said transmission line at a second position, an equivalent electrical angle between said first position and said second position being between zero and $\pi/4$ radian (45°) and said second position being located toward said oscillator load circuit from said first position, so as to decrease variation of oscillation temperature frequency characteristics caused by variation of said oscillator load circuit.

2. A solid-state MIC oscillator as claimed in claim 1, wherein said resonator has linear temperature resonant frequency variation characteristics in order to compensate the temperature characteristics of said oscillation device.

* * * * *